(12) United States Patent
Nguyen et al.

(10) Patent No.: US 9,293,224 B1
(45) Date of Patent: Mar. 22, 2016

(54) DOUBLE DATA RATE IN PARALLEL TESTING

(71) Applicant: Intel Corporation, Santa Clara, CA (US)

(72) Inventors: Dzung Nguyen, Freemont, CA (US); Luyen T. Vu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/569,983

(22) Filed: Dec. 15, 2014

(51) Int. Cl.
| | | |
|---|---|---|
| G11C 7/00 | (2006.01) |
| G11C 29/08 | (2006.01) |
| G11C 16/10 | (2006.01) |
| G11C 16/26 | (2006.01) |
| G11C 16/32 | (2006.01) |
| G11C 29/02 | (2006.01) |
| G01R 31/3177 | (2006.01) |
| G01R 31/3185 | (2006.01) |
| G11C 29/10 | (2006.01) |

(52) U.S. Cl.
CPC ............ *G11C 29/08* (2013.01); *G01R 31/3177* (2013.01); *G01R 31/318536* (2013.01); *G11C 16/10* (2013.01); *G11C 16/26* (2013.01); *G11C 16/32* (2013.01); *G11C 29/02* (2013.01); *G11C 29/10* (2013.01)

(58) Field of Classification Search
CPC .. G11C 7/222; G11C 29/02; G11C 29/50012; G11C 29/023; G11C 29/50; G11C 7/22; G11C 29/10; G11C 29/32; G01R 31/3177; G01R 31/318536; G01R 31/31715; G01R 31/31717; G01R 31/31908
USPC ........... 365/185.18, 201, 189.011, 233.1, 238
See application file for complete search history.

(56) References Cited

U.S. PATENT DOCUMENTS

| | | | |
|---|---|---|---|
| 6,345,006 B1 | 2/2002 | Ingalls et al. | |
| 7,161,860 B2 | 1/2007 | Ha et al. | |
| 7,405,586 B2 * | 7/2008 | Gupta | G01R 31/3172 714/734 |
| 8,988,965 B2 * | 3/2015 | Chung | G11C 8/18 365/148 |
| 2013/0258758 A1 | 10/2013 | Behrends et al. | |

OTHER PUBLICATIONS

Micron Technology, Synchronous Timing for DDR SDRAM, Technical Note, 2001, 3 pages, Micron Technology, Boise, ID.

* cited by examiner

*Primary Examiner* — David Lam
(74) *Attorney, Agent, or Firm* — Alpine Technology Law Group LLC

(57) ABSTRACT

Briefly, in accordance with one or more embodiments, an apparatus to test a semiconductor device comprises a controller configured to perform one or more tests on the semiconductor device, a reduce low pin count (RLPC) circuit configured to write data to the semiconductor device or read data from the semiconductor device at a double data rate (DDR) with respect to a single data rate (SDR), and pad logic to couple to the semiconductor device, the pad logic configured to provide a trimmable data access time from clock (tAC) signal to select different access times of a single data rate (SDR) or a double data rate (DDR) mode of operation, wherein a loading time or an unloading time of the semiconductor device being tested, or a combination thereof, is reduced when a DDR mode is selected.

15 Claims, 5 Drawing Sheets

DOUBLE DATA RATE IN PARALLEL TESTING

BACKGROUND

A probe card is an assembly of components used together to test integrated circuits that are formed on a silicon wafer. Such probe cards provide an interface between the testing equipment and the integrated circuit patterned on the silicon wafer. Such probe testing is performed before a semiconductor device is shipped to a customer. To test a given semiconductor die of the silicon wafer, a probe card is positioned over each die of the wafer. Probe needles on the card touch corresponding bond pads on the die. The needles act as transmitters, electronically sending information to and receiving information from the die's memory. The tests performed by the probe save packing and test costs by testing the semiconductor die prior to packaging, and further help to increase yields by allowing for repairs of some of the non-functional die and by providing data for yield analysis and enhancement.

In current probe tests for NOT AND (NAND) type integrated circuits such as NAND flash memory, a reduce low pin count (RLPC) interface is used with single data rate testing. NAND flash memory circuits have experienced a rapid increase in memory density and storage capacity. As the density of transistors that are fabricated on a NAND semiconductor device increases, the loading times and unloading times of parallel probe testing of such high density devices increase. State of the art NAND devices may take days to be tested, and test time increases with capacity. It would therefore be beneficial to be able to increase testing rates while providing minimal hardware changes to the RLPC circuit.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

Figure 1:
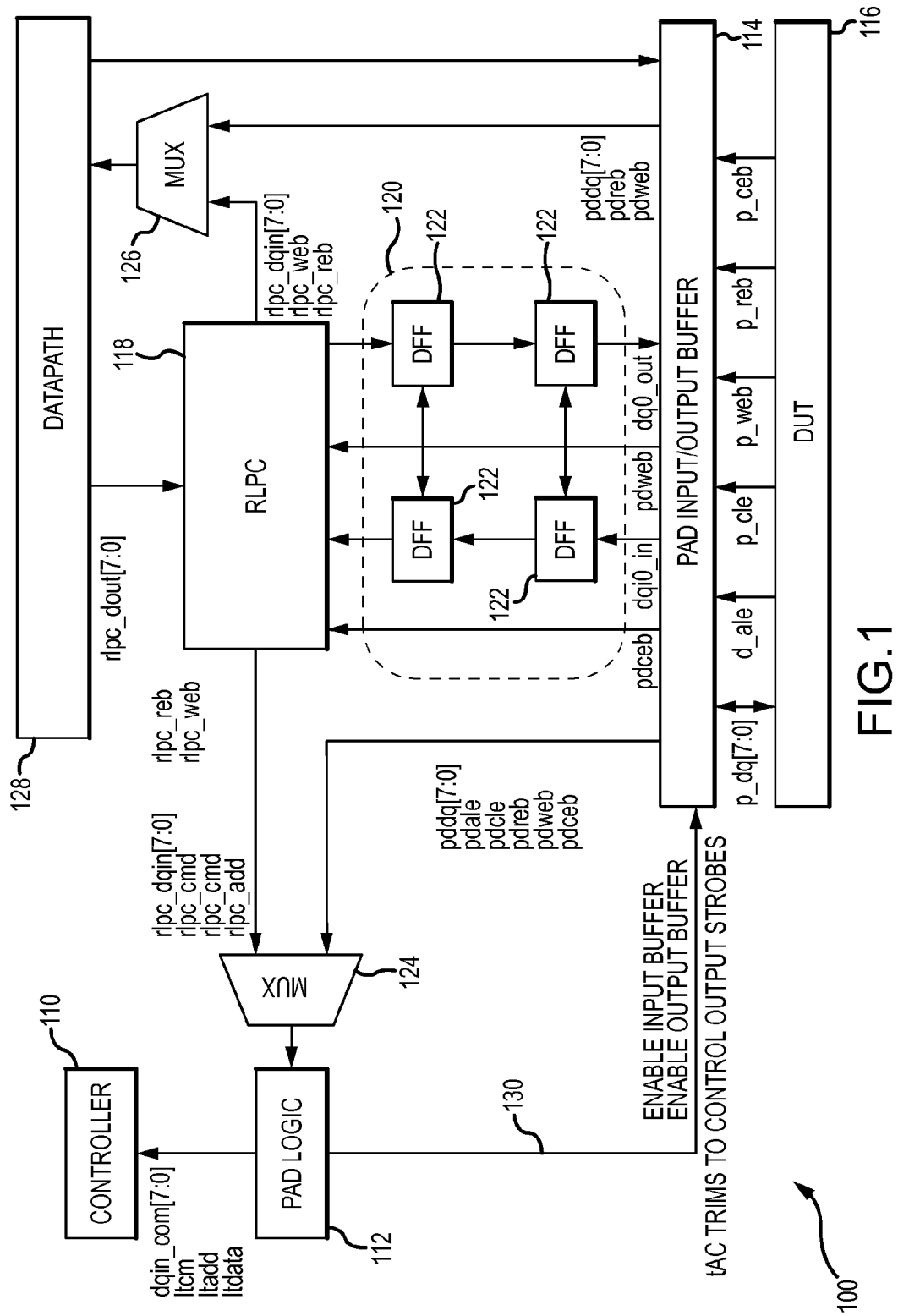
FIG. 1 is a diagram of a test circuit for a NAND type semiconductor device modified to operate at a double data rate in parallel testing in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a diagram of a test circuit for a NAND type semiconductor device modified to operate at a double data rate in parallel testing in accordance with one or more embodiments will be discussed. As shown in FIG. 1, test circuit 100 comprises a controller 110 to control the operation of tests performed by test circuit 100. Controller 110 may be configured to provide a command user interface for the tests. Controller 110 functions as a not-AND (NAND) internal master control block. Pad logic 112 is coupled to a pad input/output buffer 114 that coupled to the semiconductor device to be tested, device under test (DUT) 116. Pad logic 112 provides latch command (ltcmd) logic and other logic to enable the input and output buffers of pad input/output buffer 114. The latch command logic decides which mode the memory is in, for example, a user mode or a test mode, an input mode or an output mode, and so on. A reduce low pin count (RLPC) circuit 118 is used to control datapath 128 to provide write signals to and receive read signals from the DUT 116 during testing. In general, RLPC 118 is the main circuit to control all functions during testing. In one or more embodiments, the DUT 116 may comprise a NAND type device such as NAND flash memory, and/or a double data rate memory (DDR) device in general. DUT 116 may comprise one or more semiconductor devices such as semiconductor dies fabricated on a semiconductor wafer prior to singulation of the dies, although the scope of the claimed subject matter is not limited in these respects.

In one or more embodiments, the write signals are provided to and the read signals are received from pad input/output buffer 120 via pipeline stages 120 coupled between RLPC 118 and input/output buffer 114. The number of stages in pipeline stages is a function of the speed at which data is written to and/or read from DUT 116. Pipeline stages 120 may comprise a set of data flip-flops (DFFs) 122 as shown to synchronize the write and read signals. Pipeline stages 120 control how fast to flush in or flush out data, for example at a data rate defined as a single data rate (SDR), or a double data rate (DDR) such as DDR1, DDR2, DDR3, and so on. Compared to a single data rate interface, a double data rate interface is capable of transferring data a higher rates via control of the timing of data signals and clock signals. The term double data rate may refer to the capability of a DDR to provide data rates that are at or near twice the rate of SDR via transferring data on both the rising edge and the falling edge of a clock signal whereas data is only transferred on the rising edge of the clock signal with SDR. In one or more embodiments, an SDR or a DDR mode may be selected wherein in accordance with a Joint Electron Device Engineering Council (JEDEC) specification, although the scope of the claimed subject matter is not limited in this respect.

Output signals from RLPC 118 are provided to pad logic 112 and datapath 128 which are multiplexed with output signals from pad input/output buffer 114 via multiplexer 124 and multiplexer 126. In one or more embodiments, pad logic provides a data access time from clock (tAC) signal 130 to pad input/output buffer wherein the tAC signal 130 is trimmable to control output strobes such that RLPC 118 may operate tests on DUT 116 at a double data rate (DDR). Due to lot to lot variations or wafer to wafer variations, the tAC or number of dummy clocks will be changed causing an inaccurate output strobe. Setting the tAC signal 130 sets internal trim of a number of dummy clocks as an initial calibration at the beginning of a probe test. The trims will determine the tAC of that particular lot or wafer being tested. An example method of setting such an internal trim is shown in and described in more detail with respect to FIG. 5, below.

Figure 2:
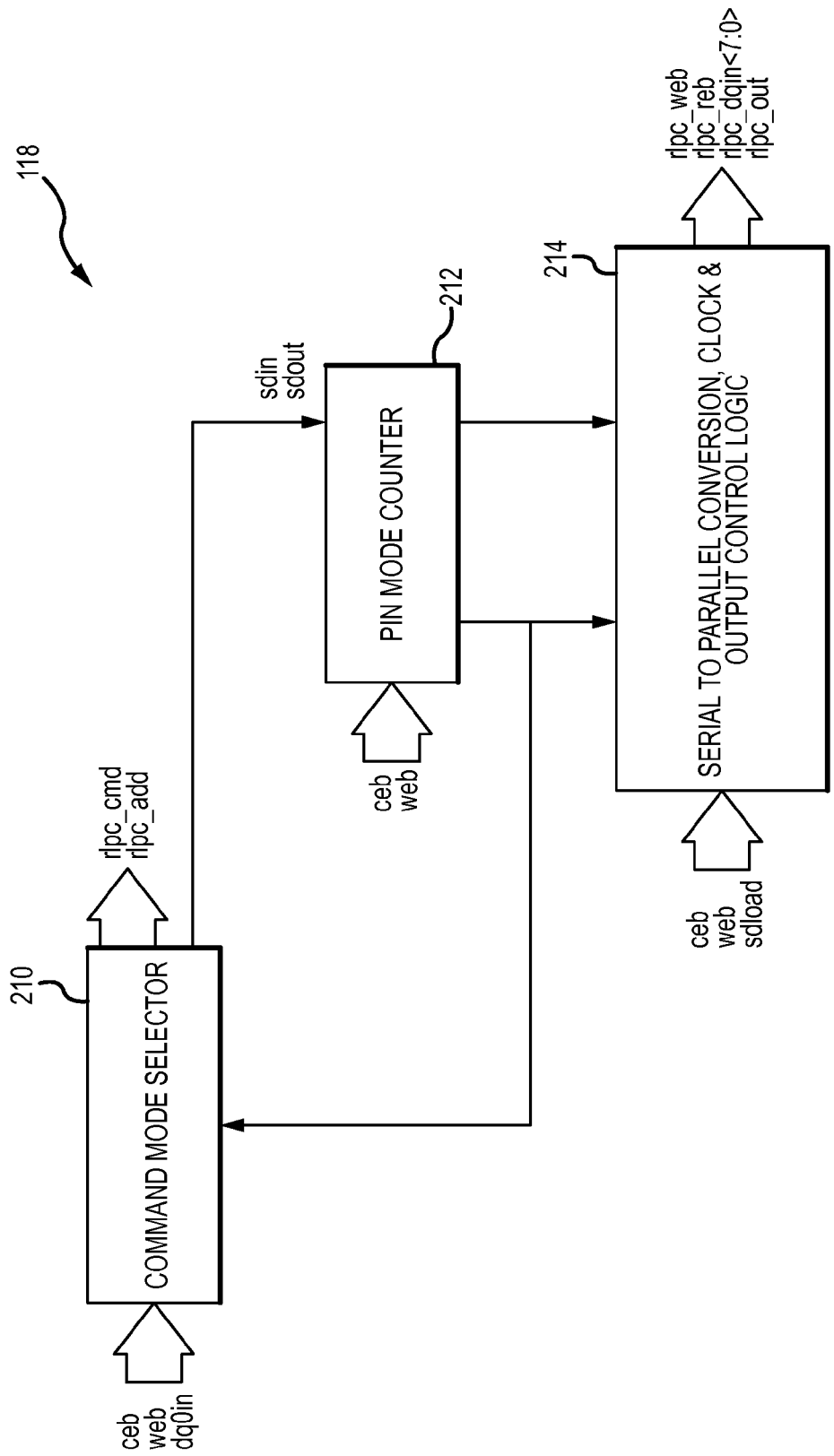
FIG. 2 is a reduce low pin count (RLPC) circuit used in the test circuit of FIG. 1 capable to operate at a double data rate in accordance with one or more embodiments.

Referring now to FIG. 2, a reduce low pin count (RLPC) circuit used in the circuit of FIG. 1 to operate at a double data rate in accordance with one or more embodiments will be discussed. RLPC circuit 118 comprises a command mode selector 210 to provide sdin and sdout signals to pin mode counter 212 and to output control logic circuit 214 which provides serial to parallel conversion, a clock signal and output control logic. Pin mode counter 212 counts dummy bits, command bits, and 8 bits or 16 bits of serial data in or out as an example. In one or more embodiments, a 3-bit decoder (ceb, web, and dq0) currently decodes the following modes: command cycle, address cycle, serial data in, serial data out, data comparator generator) for a special test pattern or mask out bits) in, and data comparator generator out. Command mode selector 210 selects which mode the device under test is in, for example a user or test mode, or an input or output mode, and so on. Pin mode counter 212 also provides an out signal to output control logic circuit 214 and to command mode selector 210. RLPC circuit 118 generates the command in (COMIN) signal and address in (ADDIN) signal as shown in the timing diagram of FIG. 3, and the serial data in (SDIN) signal and serial data out (SDOUT) signal as shown in the timing diagram of FIG. 4. RLPC circuit 118 generates these signals internally.

Figure 3:
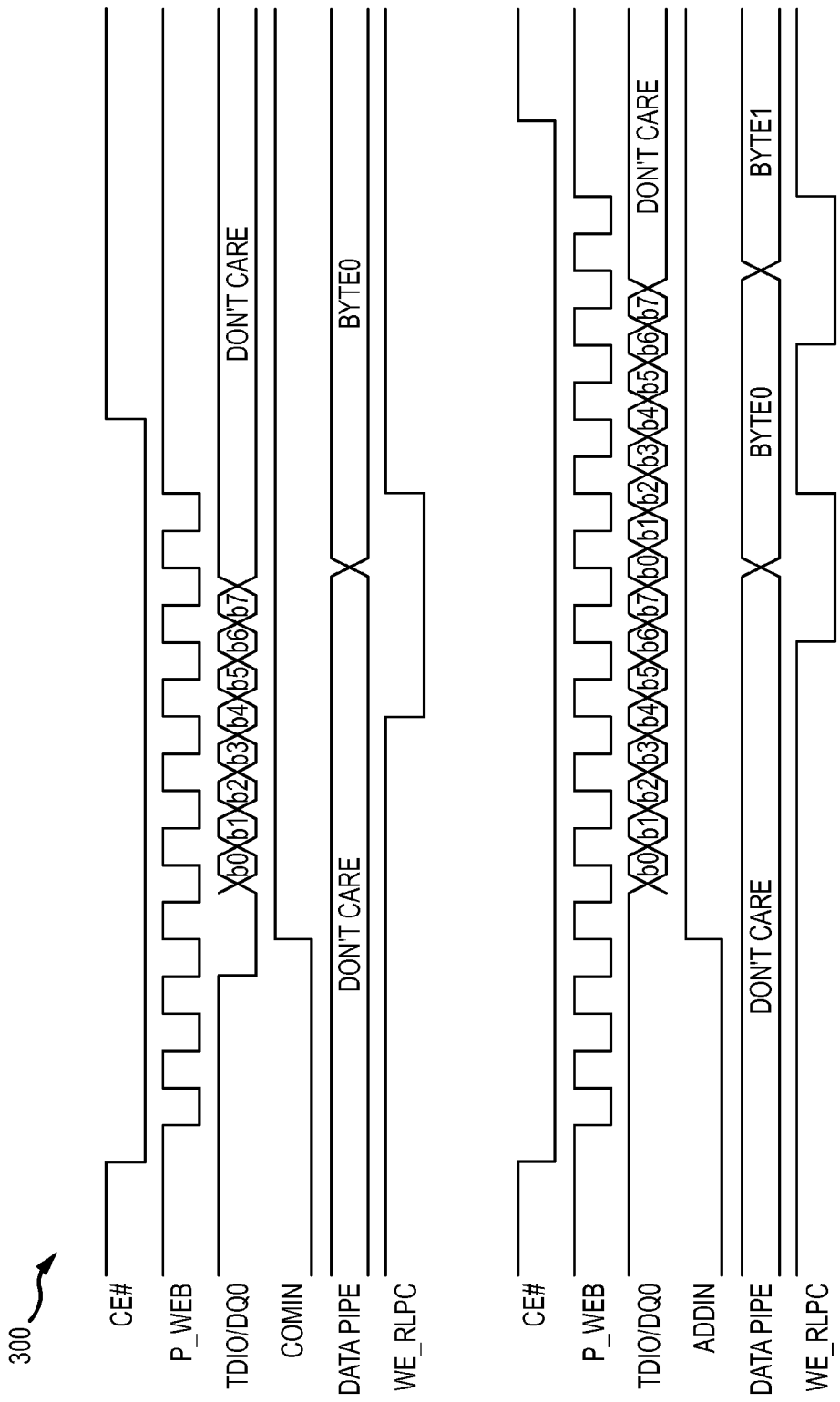
FIG. 3 is a timing diagram of the Command In and Address In signals generated by the RLPC of FIG. 2 in accordance with one or more embodiments.

Referring now to FIG. 3, a timing diagram of the Command In and Address In signals generated by the RLPC of FIG. 2 in accordance with one or more embodiments will be discussed. As shown in FIG. 3, timing of the command in (COMIN) signal with respect to other signals is shown in the upper portion of timing diagram 300, and timing of the address in (ADDIN) with respect to other signals is shown in the lower portion of timing diagram 300. In timing diagram 300, all input pins are ceb, web, and dq0. The first three signals are clocked together, and data from dq0 will determine which mode RLPC 118 is in. In one or more embodiments, for the first three clock cycles optionally may operate at a single data rate (SDR) although a double data rate (DDR) still may be utilized. With the first three clock cycles, 3 bits of data may be accumulated which can decode out up to a maximum of 8 different modes.

Figure 4:
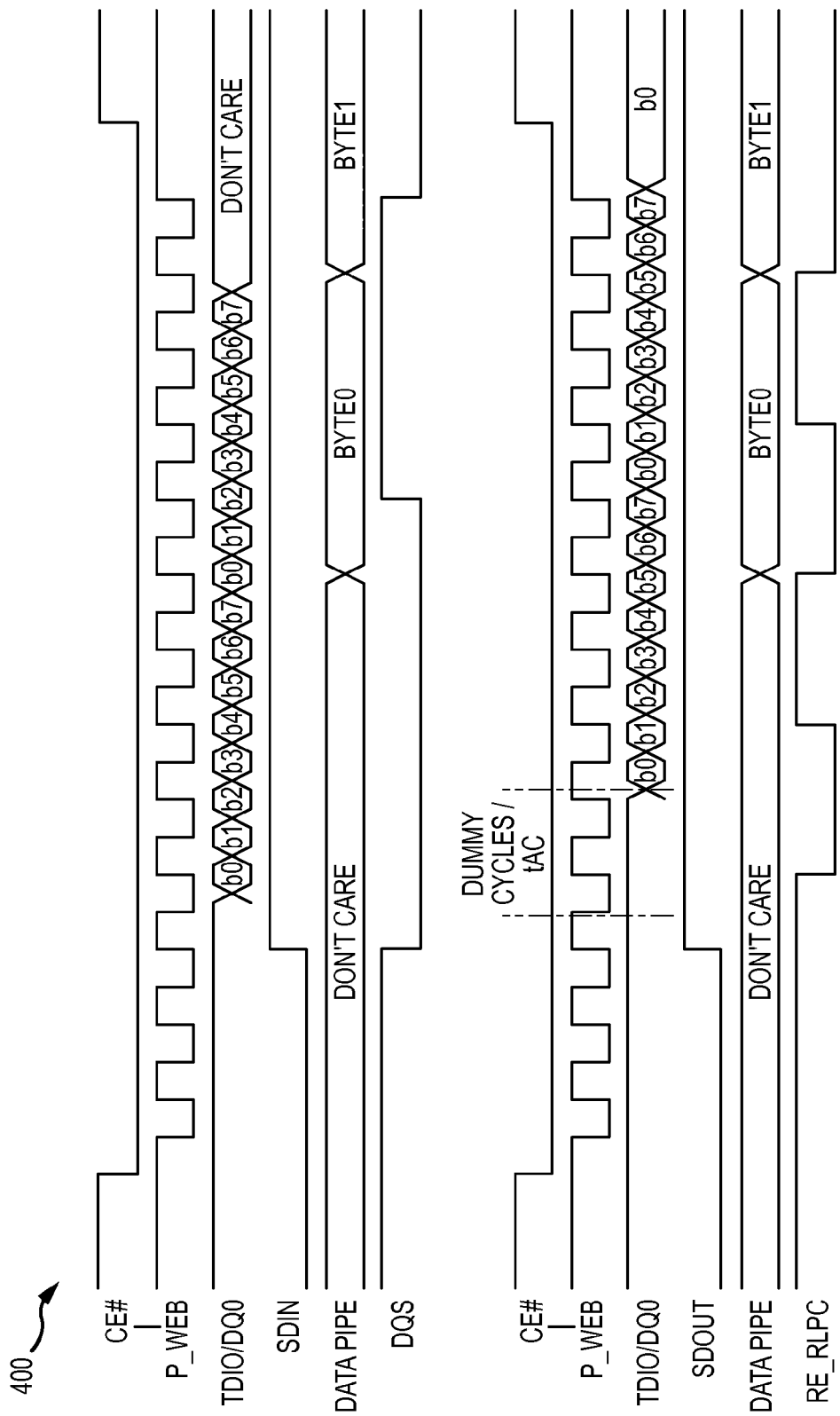
FIG. 4 is a timing diagram of the Serial Data In and Serial Data Out signals generated by the RLPC of FIG. 2 in accordance with one or more embodiments.

Referring now to FIG. 4, a timing diagram of the Serial Data In and Serial Data Out signals generated by the RLPC of FIG. 2 in accordance with one or more embodiments. As shown in FIG. 4, timing of Serial Data In (SDIN) signal with respect to other signals is shown in the upper portion of timing diagram 400, and timing of the Serial Data Out (SDOUT) with respect to other signals is shown in the lower portion of timing diagram 400. In timing diagram 400, similar to timing diagram 300, all input pins are ceb, web, and dq0. The first three signals are clocked together, and data from dq0 will determine which mode RLPC 118 is in. In one or more embodiments, for the first three clock cycles optionally may operate at a single data rate (SDR) although a double data rate (DDR) still may be utilized. With the first three clock cycles, 3 bits of data may be accumulated which can decode out up to a maximum of 8 different modes.

Figure 5:
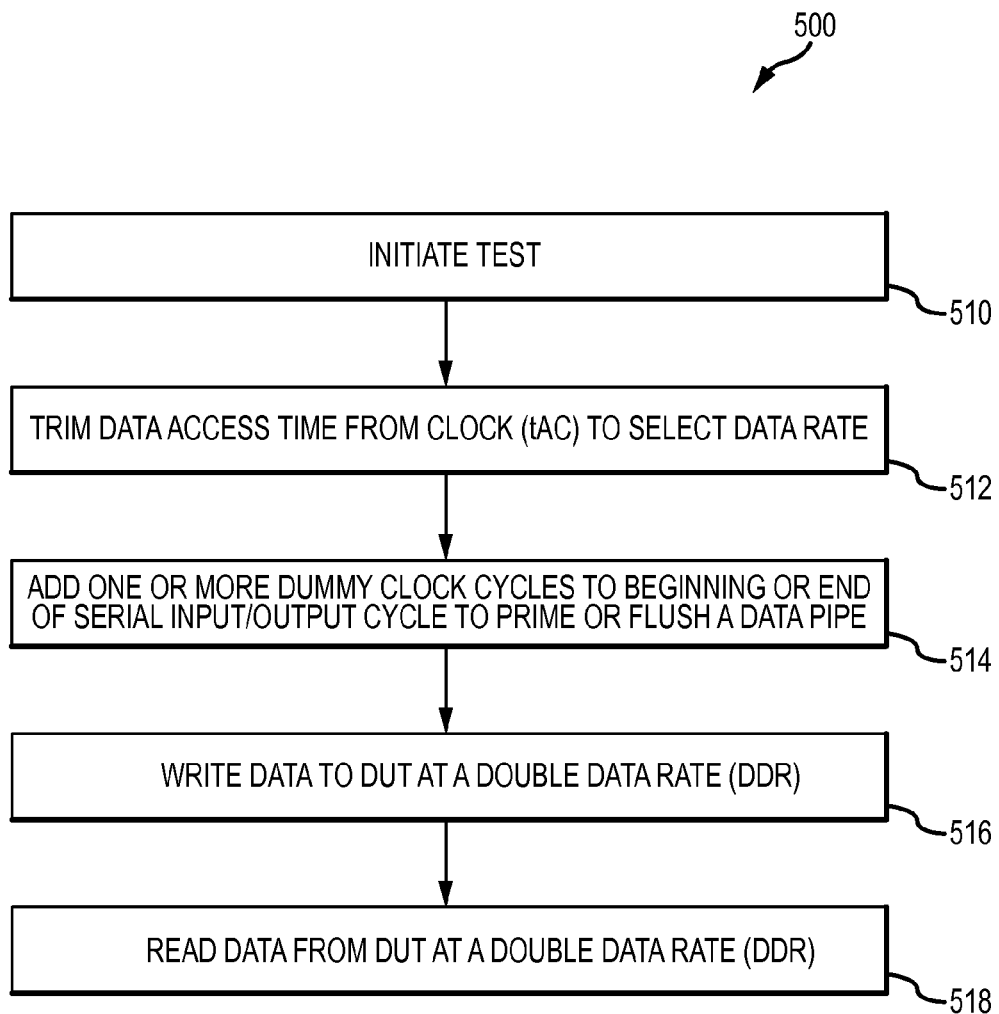
FIG. 5 is a flow diagram of a method to test a NAND type semiconductor device at a double data rate in accordance with one or more embodiments.

Referring now to FIG. 5, a flow diagram of a method to test a NAND type semiconductor device at a double data rate in accordance with one or more embodiments will be discussed. Method 500 of FIG. 5 may include more or fewer blocks than shown, and in various other orders, and the scope of the claimed subject matter is not limited in these respects. At block 510 of method 500, a test of a device under test (DUT) 116 is initiated. The data access from clock (tAC) signal may be trimmed at block 512 to select a data rate for the test, for example different access times of a double data rate (DDR) with respect to a single data rate (SDR) may be selected, or a single data rate (SDR) may be selected. Due to lot to lot variations or wafer to wafer variations, the tAC or number of dummy clocks will be changed causing an inaccurate output strobe. Setting the tAC signal 130 sets internal trim of a number of dummy clocks as an initial calibration at the beginning of a probe test. The trims will determine the tAC of that particular lot or wafer being tested. As a result, one or more dummy clock cycles may be added at block 514 to the beginning and/or end of a serial input/output cycle to prime or flush a data pipe of pipeline stages 120 during the test. Test data may be written to DUT 116 at block 516 at a double data rate (DDR), and test result data may be read from DUT 116 at block 518 at a double data rate (DDR) wherein a double date rate (DDR) is defined as being approximately twice a single data rate (SDR) as defined in accordance with a Joint Electron Device Engineering Council (JEDEC) specification, although the scope of the claimed subject matter is not limited in this respect.

Although the claimed subject matter has been described with a certain degree of particularity, it should be recognized that elements thereof may be altered by persons skilled in the art without departing from the spirit and/or scope of claimed subject matter. It is believed that the subject matter pertaining to providing a doubled, or nearly doubled or otherwise increased, data rate in parallel testing and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. An apparatus to test a semiconductor device, comprising:
    a controller configured to perform one or more tests on the semiconductor device;
    a reduce low pin count (RLPC) circuit configured to write data to the semiconductor device or read data from the semiconductor device at a double data rate (DDR) with respect to a single data rate (SDR); and
    pad logic to couple to the semiconductor device, the pad logic configured to provide a trimmable data access time from clock (tAC) signal to select different access times of a single data rate (SDR) or a double data rate (DDR) mode of operation, wherein a loading time or an unloading time of the semiconductor device being tested, or a combination thereof, is reduced when a DDR mode is selected.

2. An apparatus as claimed in claim 1, wherein the semiconductor device comprises NAND flash.

3. An apparatus as claimed in claim 1, wherein the semiconductor device comprises double data rate (DDR) memory.

4. An apparatus as claimed in claim 1, wherein one or more dummy clock cycles are added at a beginning or an end of a write and read cycle provided by the RLPC circuit to the semiconductor device to prime or flush a data pipe of data written to the semiconductor device.

5. An apparatus as claimed in claim 1, wherein the RLPC circuit comprises:
    a command mode selector;
    a pin mode counter coupled to the command mode counter; and
    control logic coupled to the command mode selector and the pin mode counter, the control logic to provide serial to parallel conversion of the write and read data.

6. A method to test a semiconductor device, comprising:
    writing data to the semiconductor device and reading data from the semiconductor device at a double data rate (DDR) with respect to a single data rate (SDR) using a reduce low pin count (RLPC) circuit; and
    providing a trimmable data access time from clock (tAC) signal to select different access times of the single data rate or the double data rate;
    wherein a loading time or an unloading time of the semiconductor device being tested, or a combination thereof, is reduced when a DDR mode is selected.

7. A method as claimed in claim 6, wherein the semiconductor device comprises NAND flash.

8. A method as claimed in claim 6, wherein the semiconductor device comprises double data rate (DDR) memory.

9. A method as claimed in claim 6, wherein one or more dummy clock cycles are added at a beginning or an end of a write and read cycle provided by the RLPC circuit to the semiconductor device to prime or flush a data pipe of data written to or read from the semiconductor device.

10. A method as claimed in claim 6, further comprising:
    adding one or more dummy cycles at a beginning of a serial input/output cycle, or at an end of a serial input/output cycle, or a combination thereof, to prime or flush a data pipe during a test.

11. An article of manufacture comprising a non-transitory storage medium having instructions stored thereon that, if executed, result in:
    writing data to the semiconductor device and reading data from the semiconductor device at a double data rate (DDR) with respect to a single data rate (SDR) using a reduce low pin count (RLPC) circuit; and
    providing a trimmable data access time from clock (tAC) signal to select different access times of the single data rate or the double data rate;
    wherein a loading time or an unloading time of the semiconductor device being tested, or a combination thereof, is reduced when a DDR mode is selected.

12. An article of manufacture as claimed in claim 11, wherein the semiconductor device comprises NAND flash.

13. An article of manufacture as claimed in claim 11, wherein the semiconductor device comprises double data rate (DDR) memory.

14. An article of manufacture as claimed in claim 11, wherein one or more dummy clock cycles are added at a beginning or an end of a write and read cycle provided by the RLPC circuit to the semiconductor device to prime or flush a data pipe of data written to or read from the semiconductor device.

15. An article of manufacture as claimed in claim 11, further comprising:
    adding one or more dummy cycles at a beginning of a serial input/output cycle, or at an end of a serial input/output cycle, or a combination thereof, to prime or flush a data pipe during a test.

* * * * *